US012696731B2

(12) United States Patent
Choi et al.

(10) Patent No.: US 12,696,731 B2
(45) Date of Patent: Jul. 28, 2026

(54) SUBSTRATE PROCESSING APPARATUS AND METHOD

(71) Applicant: Samsung Electronics Co., Ltd., Suwon-si (KR)

(72) Inventors: Hyung Jun Choi, Suwon-si (KR); Tae Hong Min, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 222 days.

(21) Appl. No.: 18/314,983

(22) Filed: May 10, 2023

(65) Prior Publication Data

US 2023/0420285 A1      Dec. 28, 2023

(30) Foreign Application Priority Data

Jun. 24, 2022    (KR) ......................... 10-2022-0077250

(51) Int. Cl.
  *H10P 72/78*        (2026.01)
  *H10P 72/00*        (2026.01)
  *H10P 72/76*        (2026.01)

(52) U.S. Cl.
  CPC .......... *H10P 72/78* (2026.01); *H10P 72/0616* (2026.01); *H10P 72/7612* (2026.01)

(58) Field of Classification Search
  CPC ............... B25B 11/005; H01L 21/6838; H01L 21/68742; H01L 21/6875; B23Q 3/088; B23Q 3/106
  See application file for complete search history.

(56) References Cited

U.S. PATENT DOCUMENTS

| | | | | |
|---|---|---|---|---|
| 4,684,113 A | * | 8/1987 | Douglas ................. | B23Q 1/035 |
| | | | | 269/21 |
| 8,748,780 B2 | | 6/2014 | Moro et al. | |
| 9,831,080 B2 | | 11/2017 | Kubota et al. | |

FOREIGN PATENT DOCUMENTS

| | | |
|---|---|---|
| JP | 2003025174 A | 1/2003 |
| JP | 2005-114882 A | 4/2005 |
| JP | 3997165 B2 | 8/2007 |
| JP | 2012-237817 A | 12/2012 |
| JP | 5868228 B2 | 1/2016 |
| KR | 10-2001-0108426 A | 12/2001 |
| KR | 100682739 B1 | 2/2007 |
| KR | 101786789 B1 | 10/2017 |

* cited by examiner

*Primary Examiner* — Christopher J. Besler
(74) *Attorney, Agent, or Firm* — Wolf, Greenfield & Sacks, P.C.

(57)          ABSTRACT

A substrate processing apparatus includes: a stage including a first region and a second region surrounding the first region, the stage configured to receive a substrate; and a plurality of pins in or on the stage and configured to adsorb the substrate with negative pressure. The plurality of pins include a plurality of first pins in the first region and are configured to be elevated at the same time, and a plurality of second pins in the second region and are configured to be elevated at the same time. In operation, the first pins are elevated and adsorb the substrate first, and then, the second pins are elevated and adsorb the substrate.

20 Claims, 20 Drawing Sheets

100

140

111
112
}110

130
124
114
123

121
122
}120

| Step | | S310 | S320 | S330 | S340 | S350 |
|---|---|---|---|---|---|---|
| Vacuum zone | Vacuum | | | | | |
| | First Pins | On | | | | Off |
| | Second Pins | | | On | | Off |
| Air zone | Air to First Pins | | | | | |
| | Air to Second Pins | | | | | |
| | Air Vent | | | | | |
| | Vacuum | | | | | |

SUBSTRATE PROCESSING APPARATUS AND METHOD

CROSS-REFERENCE TO RELATED APPLICATION

This application claims priority from Korean Patent Application No. 10-2022-0077250, filed on Jun. 24, 2022 in the Korean Intellectual Property Office, the contents of which are hereby incorporated by reference in their entirety.

BACKGROUND

The present disclosure relates to a substrate processing apparatus and method.

In order to support the recent trends toward large-capacity and highly integrated semiconductor devices, the size of semiconductor devices is continuously decreasing. Such trends increase the difficulty of semiconductor manufacturing processes in general and require high precision in such processes. Such trends also affect wafer exposure and packaging processes during the fabrication of a semiconductor device, and the characteristics of wafers affects the yield of semiconductor devices.

As the density of elements integrated on each wafer increases, the thickness of wafers decreases, and semiconductor manufacturing processes becomes complicated, warpage of wafers may occur. Warped wafers may cause chucking failure, and may result in error in product design when provided to a manufacturing facility. Thus, it is desirable to properly chuck and planarize warped wafers introduced into a manufacturing facility.

SUMMARY

Aspects of the present disclosure provide a substrate processing apparatus capable of loading and planarizing a substrate with warpage and fabricating a semiconductor device with an improved reliability.

Aspects of the present disclosure also provide a driving method of a substrate processing apparatus capable of loading and planarizing a substrate with warpage.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a substrate processing apparatus including: a stage including a first region and a second region surrounding the first region, the stage configured to receive a substrate; and a plurality of pins in or on the stage and configured to adsorb the substrate with negative pressure. The plurality of pins include a plurality of first pins in the first region and are configured to be elevated at the same time, and a plurality of second pins in the second region and are configured to be elevated at the same time. In operation, the first pins are elevated and adsorb the substrate first, and then, the second pins are elevated and adsorb the substrate.

According to another aspect of the present disclosure, there is provided a driving method of a substrate processing apparatus, including: providing a substrate processing apparatus, the substrate processing apparatus including a stage including a first region and a second region surrounding the first region, the stage configured to receive a substrate, and a plurality of pins in or on the stage and configured to adsorb the substrate with negative pressure, wherein the plurality of pins include a plurality of first pins in the first region and are configured to be elevated concurrently, and a plurality of second pins in the second region and are configured to be elevated concurrently; elevating the first pins to adsorb the substrate with the first pins; and then elevating the second pins to adsorb the substrate with the second pins.

According to still another aspect of the present disclosure, a substrate processing apparatus includes: a stage configured to receive a substrate, a light source configured to generate light, and an exposure optical system configured to receive the light and apply exposure light to an exposure region of the substrate. The stage includes a first central region and a second outer region surrounding the first central region, a plurality of first pins in the first central region and configured to adsorb the substrate, a plurality of second pins in the second outer region and configured to adsorb the substrate. The apparatus includes a vacuum pump fluidly connected to the first pins and the second pins and configured to provide negative pressure, a first pump fluidly connected to the first pins and configured to provide positive or negative pressure to raise or lower the first pins concurrently in unison, and a second pump fluidly connected to the second pins and configured to provide positive or negative pressure to raise or lower the second pins concurrently in unison.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
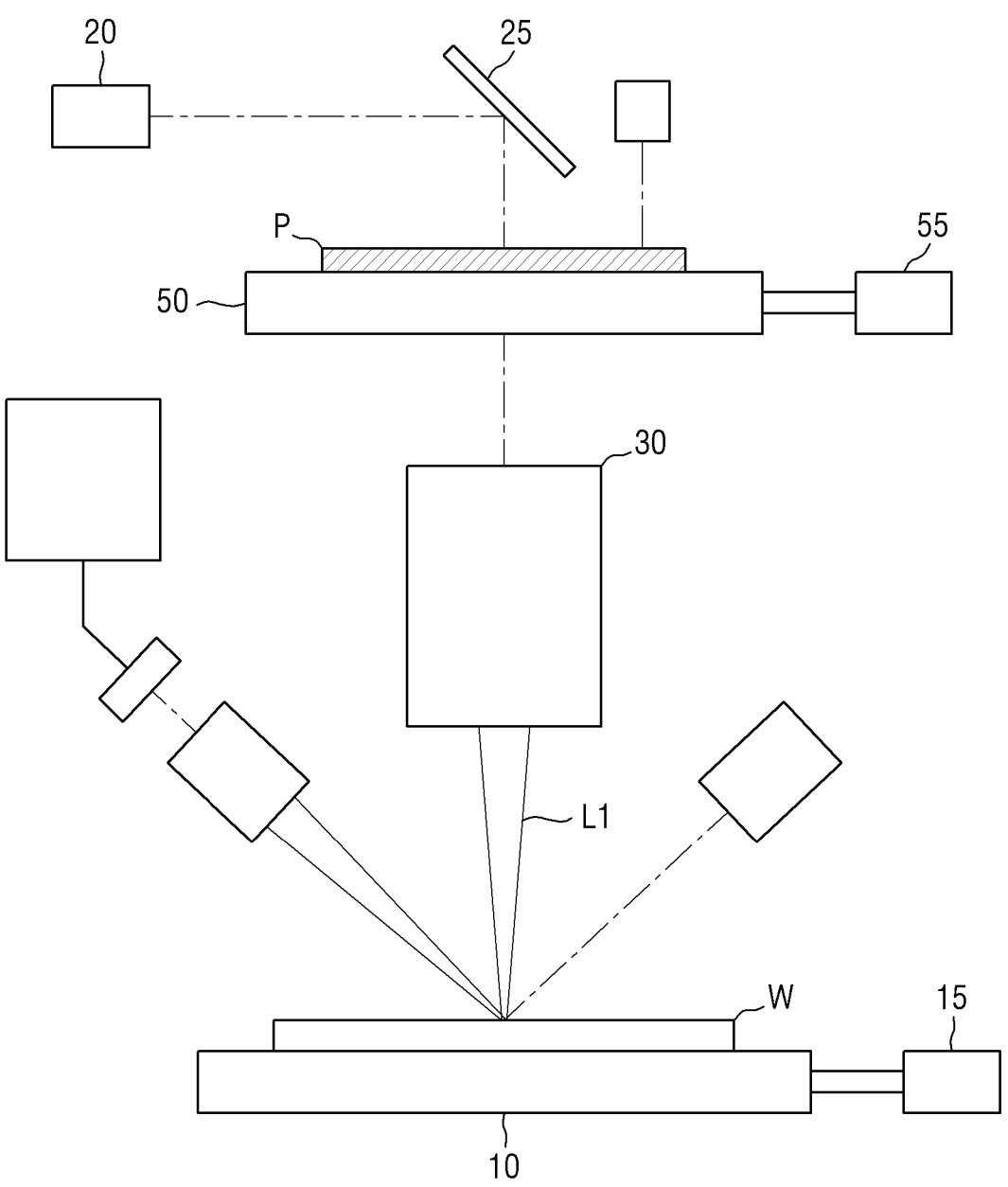
FIG. 1 illustrates a substrate processing apparatus according to an embodiment of the present disclosure.

Embodiments of the present disclosure will hereinafter be described with reference to the accompanying drawings.

Like reference numerals indicate like elements throughout the present disclosure, and thus, detailed descriptions thereof may be omitted in the interest of brevity.

FIG. 1 illustrates a substrate processing apparatus according to an embodiment of the present disclosure.

Referring to FIG. 1, the substrate processing apparatus may include a stage 10, a stage driver 15, a light source 20, a reflective lens system or reflective lens module 25, an exposure optical system 30, a reticle stage 50, a reticle stage driver 55, and a controller.

The light source 20 may generate light for performing an exposure process on a substrate W. The reflective lens module 25 may change the path of light provided by the light source 20 and may provide the light to a reticle P. The reflective lens module 25 may consist of a single reflective lens or a plurality of reflective lenses.

Light whose path is changed by the reflective lens module 25 is provided to one surface of the reticle P. The reticle P may include a pattern region, and the pattern region may block some of light. Light that is not blocked by the pattern region may be incident upon the exposure optical system 30.

The reticle P may be supported by the reticle stage 50. The reticle stage 50 may support the reticle P on the exposure optical system 30 and may move the reticle P in a horizontal direction.

The exposure optical system 30 may receive light transmitted through the reticle P and may generate exposure light L1 to be provided to the substrate W, based on the received light. The exposure optical system 30 may include, for example, a plurality of lenses or mirrors and a body tube surrounding the lenses or mirrors.

The exposure optical system 30 may be disposed on or above the substrate W. FIG. 1 illustrates that the exposure optical system 30 is disposed to overlap or align vertically with the substrate W, but the present disclosure is not limited thereto. The exposure optical system 30 may provide the exposure light L1, which does not exactly overlap or align vertically with the substrate W, to the substrate W.

An alignment sensor and a level sensor may be further disposed on the substrate W. The alignment sensor may detect an alignment mark on the reticle P and determine whether the alignment mark on the reticle P is aligned with an alignment mark on the substrate W. The controller may move the stage 10 or the reticle stage 50 depending on whether the substrate W and the reticle P are aligned with each other, as detected by the alignment sensor.

The stage 10 may load or hold the substrate W. The stage driver 15 may horizontally move the stage 10. During exposure, the stage driver 15 may continue to move the stage 10. The stage 10 will hereinafter be described.

Figure 2:
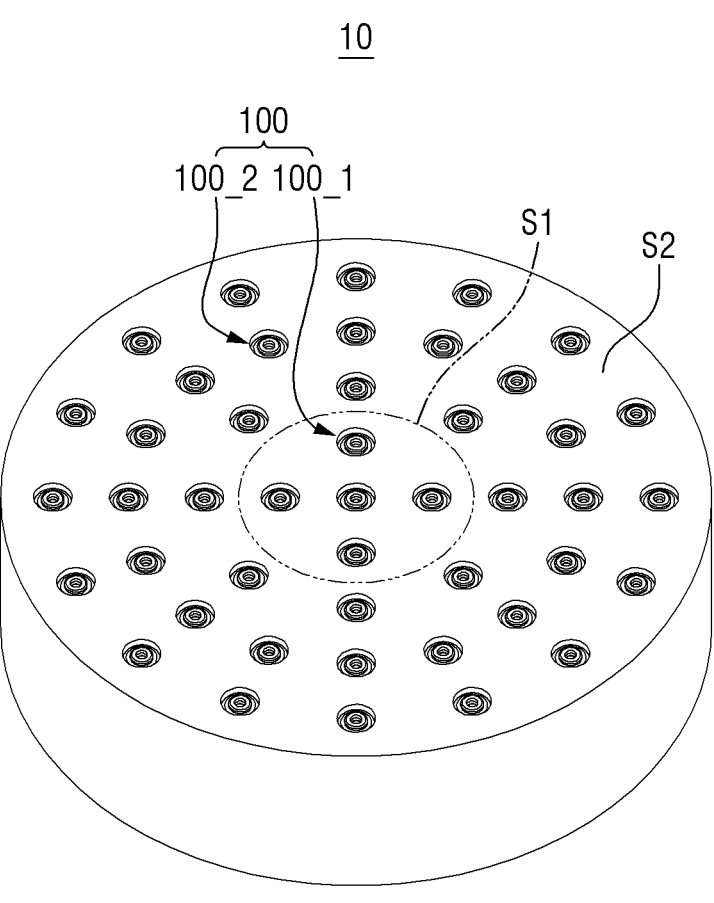
FIG. 2 is a perspective view of a stage of FIG. 1.
Figure 3:
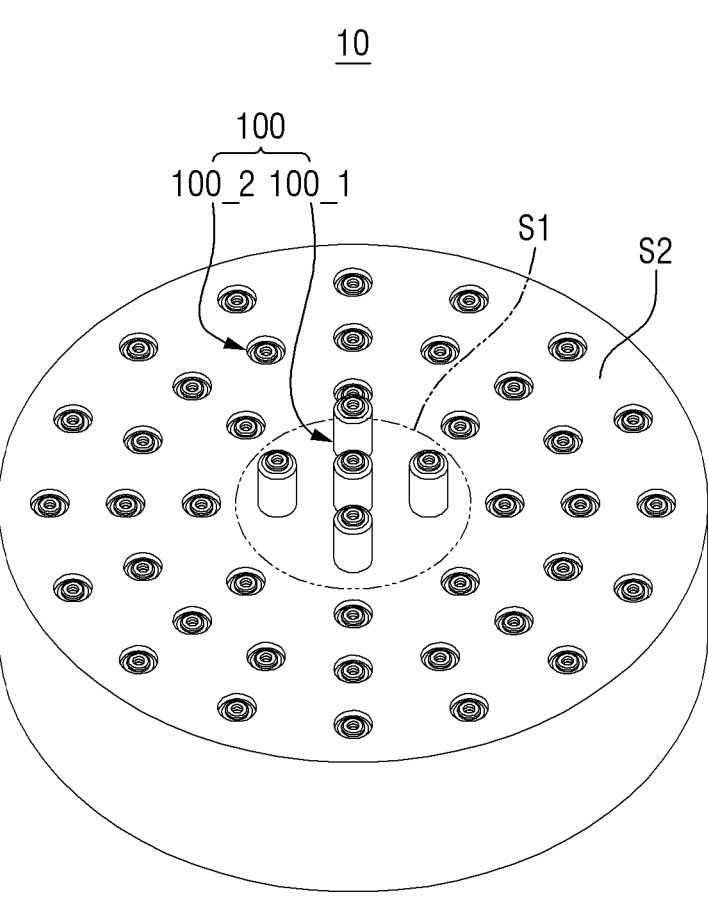
FIG. 3 is a perspective view illustrating an operation of the stage of FIG. 2.
Figure 4:
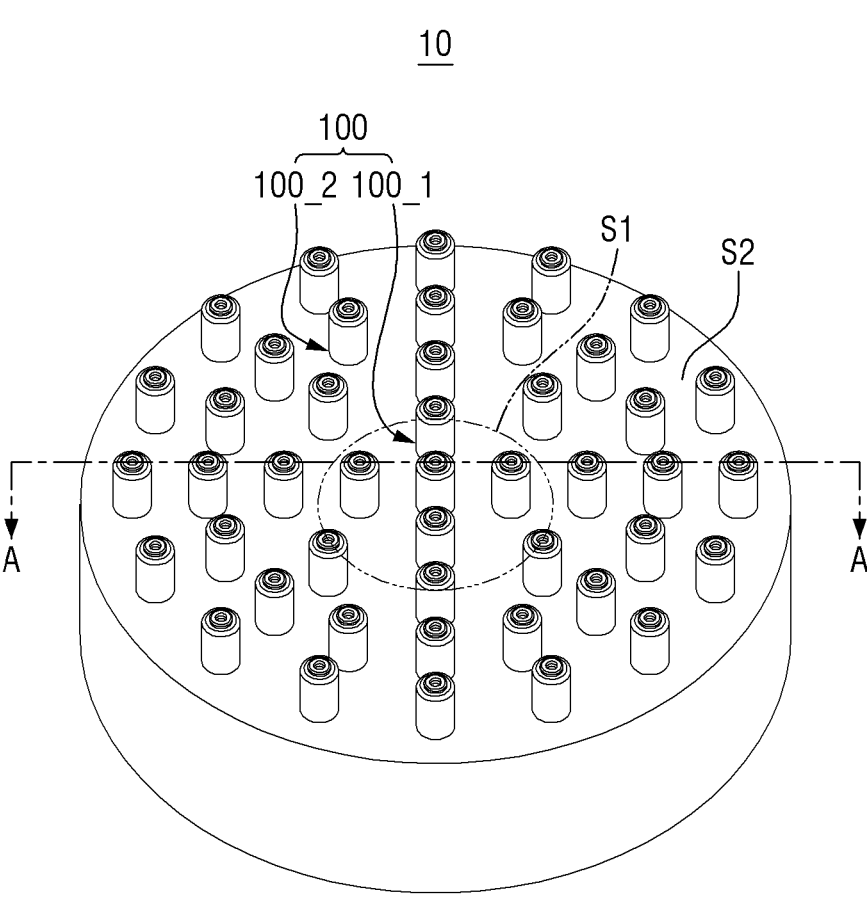
FIG. 4 is a perspective view illustrating another operation of the stage of FIG. 2

FIG. 2 is a perspective view of the stage of FIG. 1. FIG. 3 is a perspective view illustrating an operation of the stage of FIG. 2. FIG. 4 is a perspective view illustrating another operation of the stage of FIG. 2.

Referring to FIGS. 2 through 4, the stage 10 may include a first region Si, a second region S2, and a plurality of pins 100.

The stage 10 may be positioned in the substrate processing apparatus such as, for example, an exposure apparatus. The stage 10 may be positioned below the exposure optical system 30. The stage 10 may be connected to the stage driver 15.

The substrate W may be provided on the stage 10. The stage 10 may load or hold the substrate W. The stage 10 may adsorb or adhere the substrate W. The substrate W adsorbed to the stage 10 may be fixed on the stage 10 in an exposure process. The stage driver 15 may move the stage 10. The stage driver 15 may rotate in a clockwise or counterclockwise direction and may tilt the stage 10.

The stage 10 may have a circular shape in a plan view, but the present disclosure is not limited thereto. The stage 10 may include a first region S1 in the middle or middle portion thereof. The stage 10 may include a second region S2 surrounding the first region S1. The first and second regions S1 and S2 are illustrated as being circular, but the present disclosure is not limited thereto. The first region S1 may account for the middle of the top surface of the stage 10, and the second region S2 may account for the rest of the top surface of the stage 10. However, the present disclosure is not limited to this configuration.

The pins 100 may include first pins 100_1 and second pins 100_2. The pins 100 will be described in more detail below with reference to FIGS. 5 and 6. The pins 100 may be positioned in the stage 10. The pins 100 may penetrate the stage 10. A plurality of pins 100 may be provided. The pins 100 may adsorb the substrate W with negative pressure provided thereto.

The first pins 100_1 may be positioned in the first region S1 of the stage 10. The first pins 100_1 may be positioned in the middle of the stage 10. A plurality of first pins 100_1 may be provided. In some embodiments, three or more first pins 100_1 may be provided. FIG. 2 illustrates that five first pins 100_1 are provided, but the present disclosure is not limited thereto. The number of first pins 100_1 may vary depending on conditions and manufacturing equipment.

The second pins 100_2 may be positioned in the second region S2 of the stage 10. The second pins 100_2 may surround the first pins 100_1. The second pins 100_2 may be positioned along the outer circumference of the stage 10. The second pins 100_2 may be arranged concentrically with respect to the center of the stage 10. In other words, the second pins 100_2 may be arranged in multiple radially extending columns, but the present disclosure is not limited thereto. Alternatively, the second pins 100_2 may be randomly arranged in the second region S2.

The distance between the first pins 100_1 may differ from one location to another location. The distance between the second pins 100_2 may differ from one location to another location. The distance between the first pins 100_1 may differ from the distance between the second pins 100_2. For example, the distance between the second pins 100_2 may be less than the distance between the first pins 100_1. The closer the first pins 100_1 and the second pins 100_2 are to one another, the easier it may be to planarize a substrate with a high curvature.

In some embodiments, the number of second pins 100_2 may be greater than the number of first pins 100_1. The number of second pins 100_2 is not limited to that illustrated in FIG. 2. The number of second pins 100_2 may vary depending on conditions and manufacturing equipment.

In some embodiments, at least one of the first pins 100_1 may be surrounded by the second pins 100_2.

Referring to FIGS. 2 through 4, the stage 10 may be provided with both the first pins 100_1 and the second pins 100_2 lowered. To load the substrate W on the stage 10, the first pins 100_1 may be elevated or raised at the same time or concurrently (e.g., in unison). Thereafter, the second pins 100_2 may be lowered at the same time or concurrently (e.g., in unison). Here, the substrate W may be a wafer with warpage or curvature, i.e., a warpage wafer.

Figure 5:
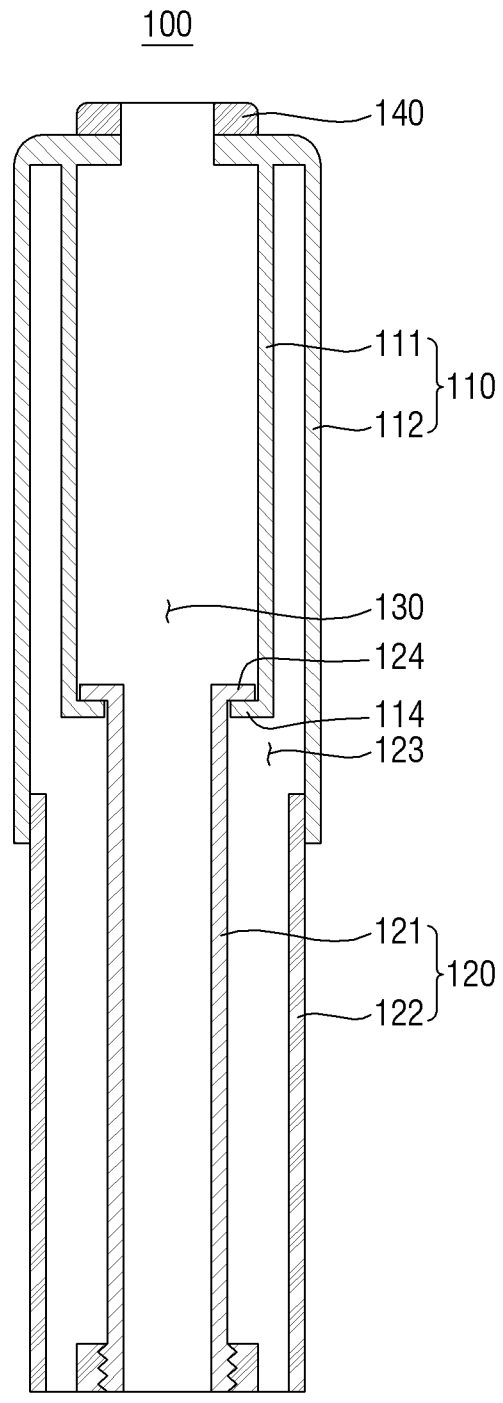
FIGS. 5 and 6 are cross-sectional views of a pin installed in the stage of FIG. 2.
Figure 6:
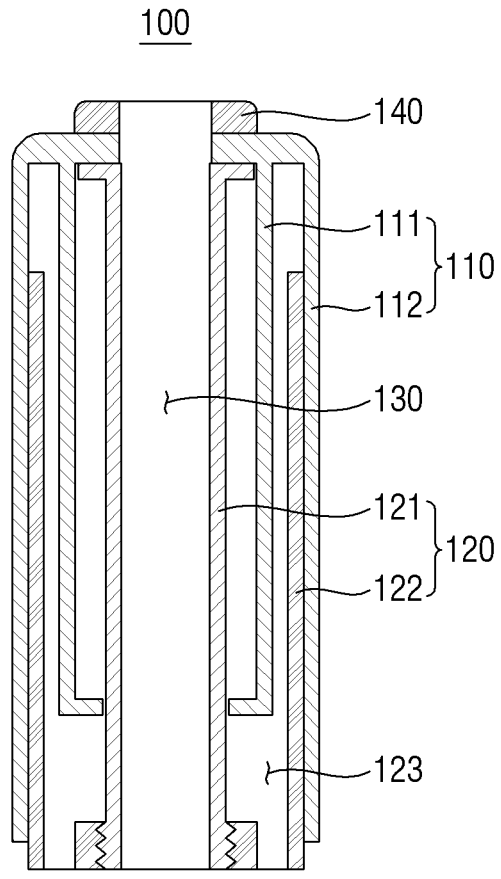

FIGS. 5 and 6 are cross-sectional views of a pin installed in the stage of FIG. 2. FIG. 5 illustrates a pin with a sub-pin elevated. FIG. 6 illustrates a pin with a sub-pin lowered.

Referring to FIGS. 5 and 6, a pin 100 may include a sub-pin 110, a support member 120, pressure space 123, and a through hole 130.

The sub-pin 110 may be elevated by positive pressure. The sub-pin 110 may be lowered by negative pressure. The sub-pin 110 may be in contact with a substrate W. The sub-pin 110 may adsorb or be adhered to the substrate W with negative pressure provided to the through hole 130.

The sub-pin 110 may be positioned above the support member 120. The support member 120 may be fixed inside the stage 10. The support member 120 may be disposed to penetrate the stage 10. The support member 120 may include a first part or portion 121 (also referred to herein as the first support member), which is disposed inside the support member 120, and a second part or portion 122 (also referred to herein as the second support member), which is disposed on the outside of and spaced apart from the first part 121. The pin 100 may include the sub-pin 110 and the through hole 130, which penetrating or extends through the first part 121.

The sub-pin 110 may include inner and outer cylinders 111 and 112, with the through hole 130 formed in the inner cylinder 111. The inside of the sub-pin 110 may be formed by the inner and outer cylinders 111 and 112, which have a cylindrical shape. The inner cylinder 111 of the sub-pin 110 may have a cylindrical shape with end portions formed at the top and bottom thereof, but the present disclosure is not limited thereto.

The structure of the pin 100 with the sub-pin 110 elevated will hereinafter be described with reference to FIG. 5. The sub-pin 110 may be elevated by positive pressure provided to the pressure space 123. The sub-pin 110 may overlap with part of the support member 120. Specifically, when the sub-pin 110 is elevated, part of the outer cylinder 112 of the sub-pin 110 may be disposed on the outside of an upper portion of the second part 122 of the support member 120.

The inner cylinder 111 of the sub-pin 110 may overlap with a portion of the first part 121 of the support member 120 in a height direction. Here, the height direction may be a direction in which the sub-pin 110 is elevated or lowered. A lower hole of the inner cylinder 111 may be hollow in the middle in the shape of a donut. As illustrated in FIG. 5, a cross section of the inner cylinder 111 may have an L shape, and the first support member 121 may have a reverse L shape. The hole in the inner cylinder 111 and the upper portion of the first support member 121 may overlap with each other and may thus limit the range in which the sub-pin 110 is elevated. For example, the sub-pin 110 cannot be elevated to the height where the inner cylinder 111 is separated from the first support member 121. A lower portion of the inner cylinder 111 may include a (radially inwardly extending) flange 114 and an upper portion of the first support member 121 may include a (radially outwardly extending) flange or stopper 124. The flanges of the inner cylinder 111 and the first support member 121 may engage and may thus limit the range in which the sub-pin 110 is elevated.

The structure of the pin with the sub-pin 110 lowered will hereinafter be described with reference to FIG. 6. The sub-pin 110 may be lowered in response to negative pressure to the pressure space 123 or may be lowered in response to the positive pressure provided to the pressure space 123 being released. The top surface or flange of the first portion 121 of the support member 120 may be in contact with the top of the sub-pin 110 so that the sub-pin 110 may not be lowered any further.

The pressure space 123 may be defined by the sub-pin 110 and the first and second portions 121 and 122 of the support member 120. The pressure space 123 may be sealed by the sub-pin 110 and the first and second portions 121 and 122 of the support member 120. In other words, a gas or liquid provided to the pressure space 123 may not flow into the inner cylinder 111. The pressure space 123 may be connected to a first pump 310 or a second pump 320 that will be described below.

In some embodiments, the pin 100 may further include an adsorption member or adherence member 140.

The adsorption member 140 may be positioned above the sub-pin 110. The adsorption member 140 may be disposed between the sub-pin 110 and the substrate W. The adsorption member 140 may have a circular shape with a hole defined therein. The hole of the adsorption member 140 may be connected to the through hole 130 and may be provided with negative pressure. The adsorption member 140 may improve the adhesion to the substrate W and may prevent the substrate W from being scratched during the adsorption of the substrate W.

The adsorption member 140 may be formed of a material with an elastic force. The adsorption member 140 may be formed of a rubber material. For example, the adsorption member 140 may be formed of polytetrafluoroethylene such as Gore-Tex®, but the present disclosure is not limited thereto.

Figure 7:
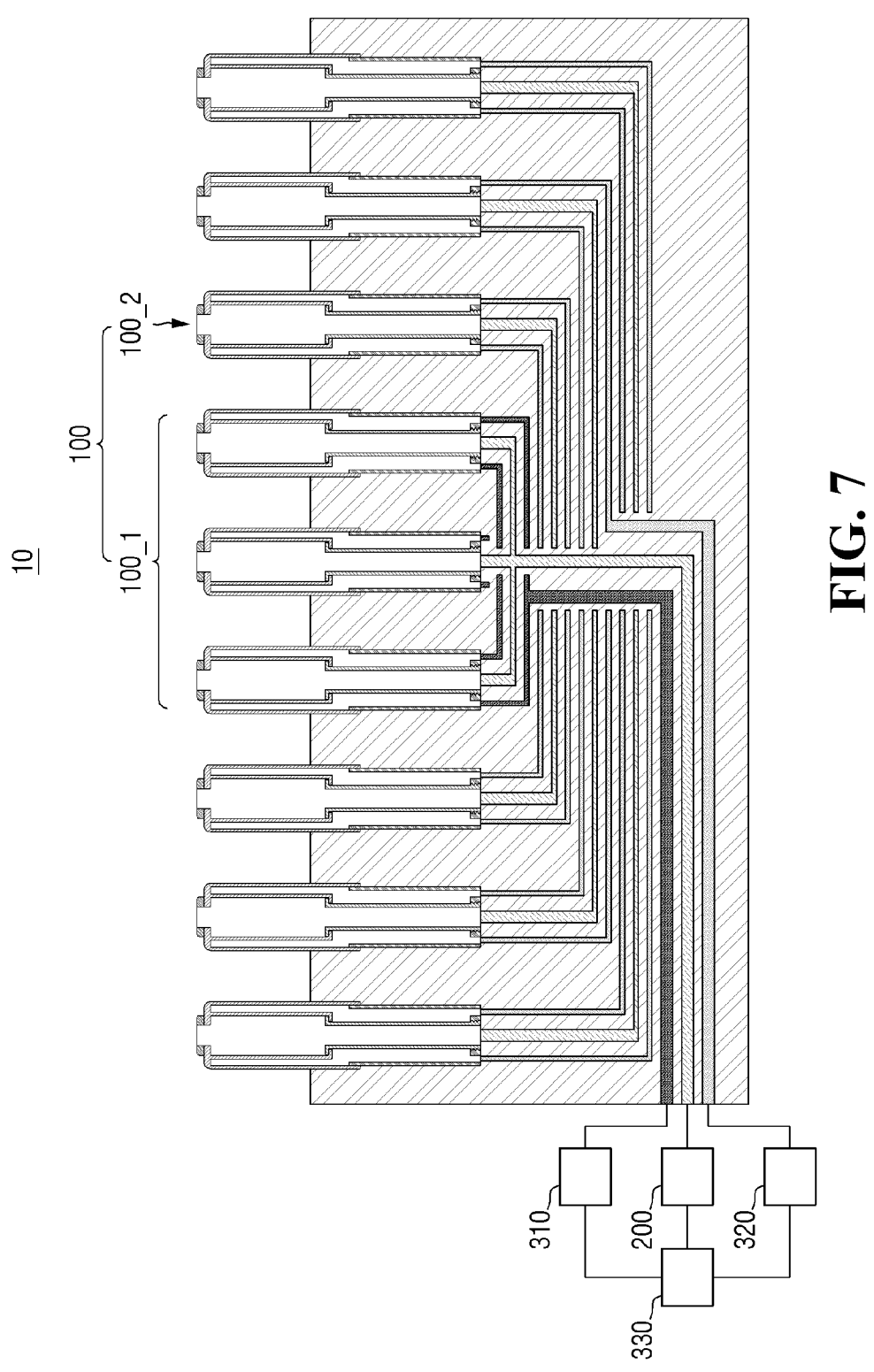
FIG. 7 is a cross-sectional view of a stage for use in a substrate processing apparatus according to another embodiment of the present disclosure.

FIG. 7 is a cross-sectional view of a stage for use in a substrate processing apparatus according to another embodiment of the present disclosure. FIG. 7 is a cross-sectional view taken along line A-A of FIG. 4.

Referring to FIG. 7, the substrate processing apparatus may include a vacuum pump 200, a first pump 310, and a second pump 320.

The vacuum pump 200 may be connected to through holes 130 of pins 100. Pipes connecting the vacuum pump 200 and the through holes 130 may be disposed in a stage 10. The vacuum pump 200 may provide negative pressure to the pins 100 so that the pins 100 may adsorb a substrate W or so that the substrate W may be adhered to the pins 100. One vacuum pump 200 may be connected to through holes 130 of first pins 100_1 and through holes 130 of second pins 100_2. The vacuum pump 200 may provide negative pressure to all the pins 100 at the same time or concurrently.

The first pump 310 may be connected to pressure spaces 123 of the first pins 100_1. Pipes connecting the first pump 310 and the pressure spaces 123 of the first pins 100_1 may be disposed in the stage 10. The first pump 310 may provide positive pressure to the pressure spaces 123 of the first pins 100_1 and may thus elevate the first pins 100_1. The first pump 310 may release the positive pressure provided to the pressure spaces 123 of the first pins 100_1. The first pump 310 may provide negative pressure to the spaces 123 of the first pins 100_1 and may thus lower the first pins 100_1. The first pump 310 may be a pump injecting air or liquid, but the present disclosure is not limited thereto.

The second pump 320 may be connected to pressure spaces 123 of the second pins 100_2. Pipes connecting the second pump 320 and the pressure spaces 123 of the second pins 100_2 may be disposed in the stage 10. The second pump 320 may provide positive pressure to the pressure spaces 123 of the second pins 100_2 and may thus elevate the second pins 100_2. The second pump 320 may release the positive pressure provided to the pressure spaces 123 of the second pins 100_2. The second pump 320 may provide negative pressure to the spaces 123 of the second pins 100_2 and may thus lower the second pins 100_2. The second pump 320 may be a pump injecting air or liquid, but the present disclosure is not limited thereto.

One first pump 310 may be connected to all the first pins 100_1. One second pump 320 may be connected to all the second pins 100_2. In other words, the first pump 310 may elevate or lower all the first pins 100_1 at the same time or concurrently (e.g., in unison), and the second pump 320 may elevate or lower all the second pins 100_2 at the same time or concurrently (e.g., in unison). That is, the pressure spaces 123 of the first pins 100_1 may be connected to one another, and the pressure spaces 123 of the second pins 100_2 may be connected to one another.

A controller 330 may control the operations of the vacuum pump 200, the first pump 310, and the second pump 320. As the adsorption of the substrate W by the pins 100 can be controlled by a single vacuum pump 200, a single first pump 310, and a single second pump 320, the operation of the substrate processing apparatus can be straightforward.

Figure 8:
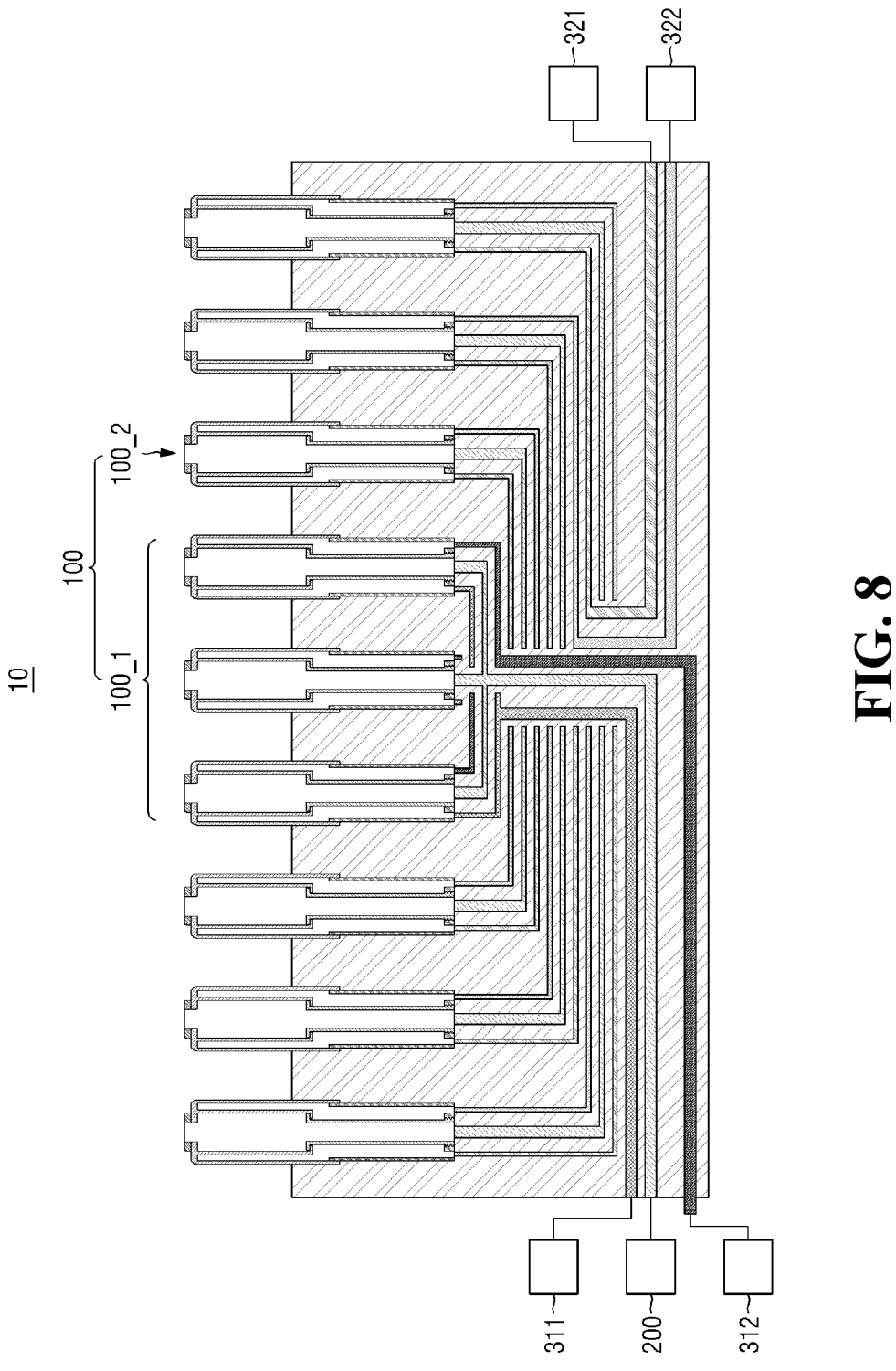
FIG. 8 is a cross-sectional view of a stage for use in a substrate processing apparatus according to another embodiment of the present disclosure.

FIG. 8 is a cross-sectional view of a stage for use in a substrate processing apparatus according to another embodiment of the present disclosure. For convenience, the embodiment of FIG. 8 will hereinafter be described, focusing mainly on the differences with the embodiment of FIG. 7.

Referring to FIG. 8, the substrate processing apparatus may include a vacuum pump 200, a first sub-pump 311, a second sub-pump 312, a third sub-pump 321, and a fourth sub-pump 322.

The first sub-pump 311 may be connected to pressure spaces 123 of first pins 100_1. The first sub-pump 311 may provide positive pressure to the pressure spaces 123 of the first pins 100_1 and may thus elevate the first pins 100_1.

The second sub-pump 312 may be connected to the pressure spaces 123 of the first pins 100_1. The second sub-pump 312 may provide negative pressure to the pressure spaces 123 of the first pins 100_1 and may thus lower the first pins 100_1.

The third sub-pump 321 may be connected to pressure spaces 123 of second pins 100_2. The third sub-pump 321 may provide positive pressure to the pressure spaces 123 of the second pins 100_2 and may thus elevate the second pins 100_2.

The fourth sub-pump 322 may be connected to the pressure spaces 123 of the second pins 100_2. The fourth sub-pump 322 may provide negative pressure to the pressure spaces 123 of the second pins 100_2 and may thus lower the second pins 100_2.

The first and third sub-pumps 311 and 321 may be pumps injecting a gas or liquid, and the second and fourth sub-pumps 312 and 322 may be pumps releasing a gas or liquid. However, the present disclosure is not limited thereto. For convenience, the first and third sub-pumps 311 and 321 will hereinafter be described as being pumps injecting a gas or liquid, and the second and fourth sub-pumps 312 and 322 will hereinafter be described as being pumps releasing a gas or liquid.

A controller (such as the controller 330 of FIG. 7) may control the operations of the first, second, third, and fourth sub-pumps 311, 312, 321, and 322 and optionally the vacuum pump 200. The controller may be configured to inject a gas or liquid to the first pins 100_1 and the second pins 100_2 via the first and third sub-pumps 311 and 321 to maintain a substrate W at a target temperature during a semiconductor manufacturing process. For example, if the temperature of the substrate W is raised above the target temperature due to an exposure process, the controller may inject a gas or liquid having a lower temperature than the target temperature to the first and third sub-pumps 311 and 321 to control the temperature of the substrate W to be around the target temperature.

FIGS. 7 and 8 illustrate that three first pins 100_1 and six second pins 100_2 are provided, but the present disclosure is not limited thereto. The numbers of first pins 100_1 and second pins 100_2 may vary depending on conditions and manufacturing equipment.

Figure 9:
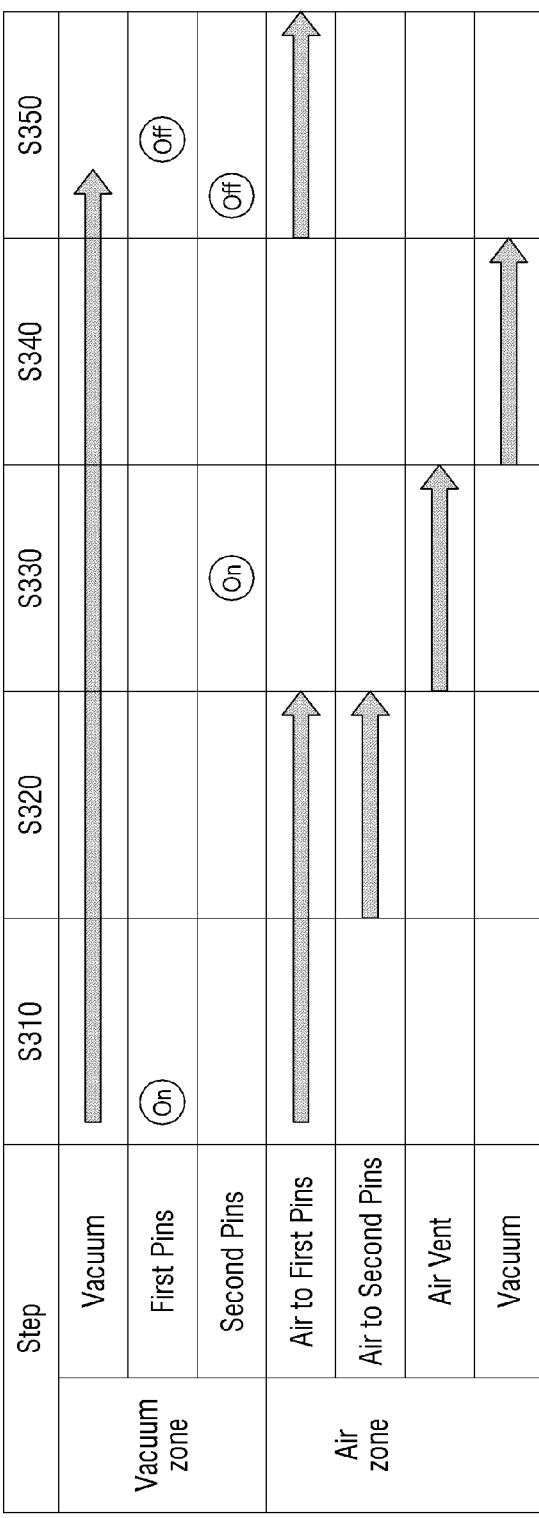
FIGS. 9 and 10 are timing diagrams for explaining a driving method of a substrate processing apparatus according to an embodiment of the present disclosure.
Figure 10:
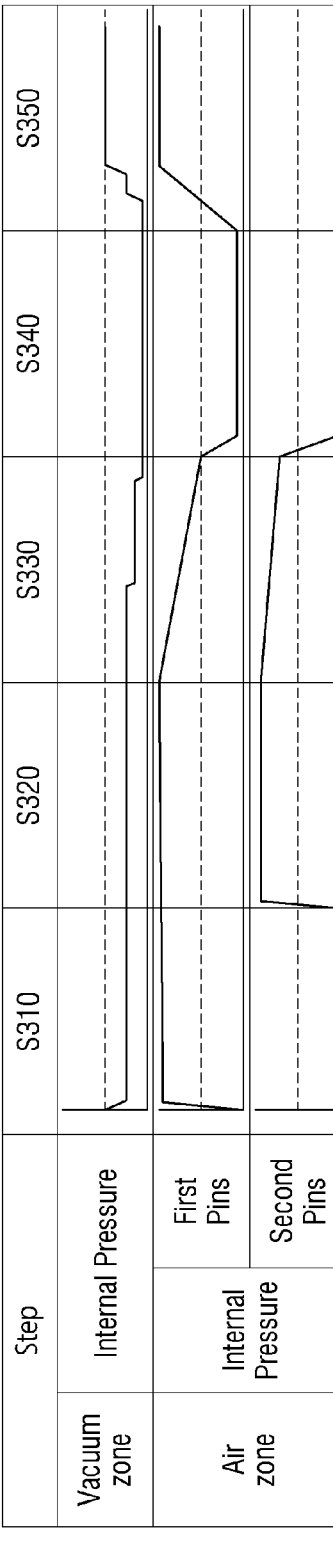
Figure 11:
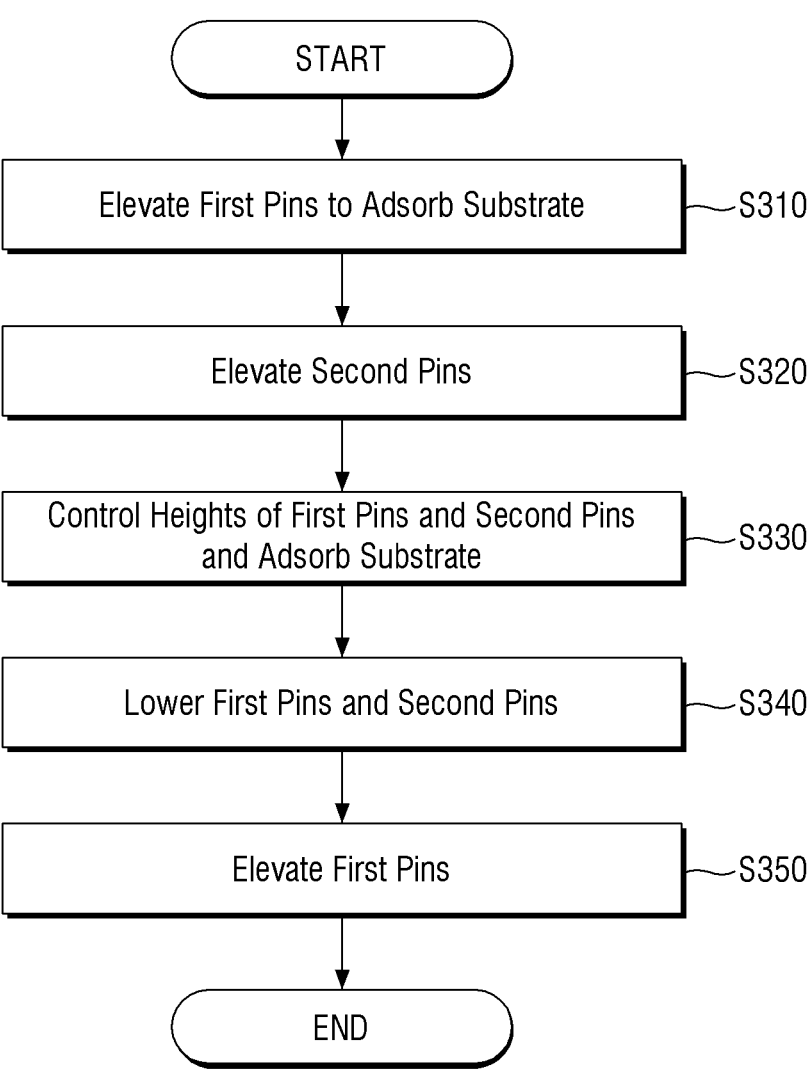
FIG. 11 is a flowchart corresponding to the timing diagrams of FIGS. 9 and 10.

FIGS. 9 and 10 are timing diagrams for explaining a driving method of a substrate processing apparatus according to an embodiment of the present disclosure. FIG. 11 is a flowchart corresponding to the timing diagrams of FIGS. 9 and 10. FIGS. 12 through 16 are cross-sectional views illustrating intermediate steps of the driving method of FIGS. 9 through 11.

The substrate processing apparatuses of FIGS. 1 through 8 may be used in the driving method of FIGS. 9 and 10. FIG. 9 explains steps of a driving method of the substrate processing apparatus of any one of FIGS. 1 through 8, and FIG. 10 explains inner pressure during each of the steps of the driving method. Referring to FIGS. 9 and 10, "Vacuum zone" may refer to the through holes 130, and "Air zone" may refer to the pressure spaces 123.

A substrate W with curvature or warpage may be provided to the stage 10. Although not specifically illustrated, the substrate W may be loaded on the stage by a loading arm of a substrate transfer apparatus. For example, the substrate W may have a convexly curved surface in a direction toward the stage 10.

Figure 12:
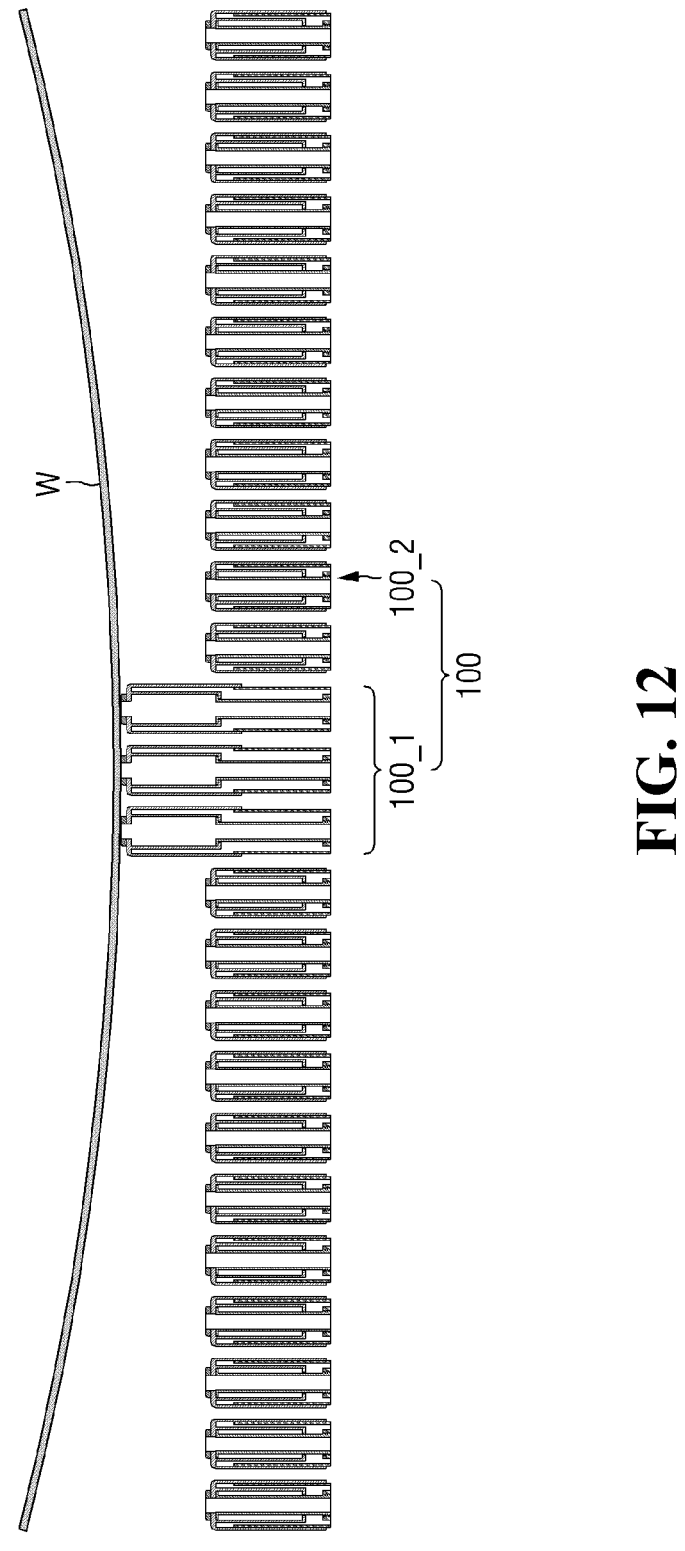
FIGS. 12 through 16 are cross-sectional views illustrating intermediate steps of the driving method of FIGS. 9 through 11.

Referring to FIGS. 11 and 12, the first pins 100_1 are elevated to adsorb the substrate W (S310).

Specifically, the loading arm moves the substrate W over the stage 10. Negative pressure may be provided to the first pins 100_1 and the second pins 100_2 by the vacuum pump 200. The first pump 310 may provide positive pressure to the pressure spaces 123 of the first pins 100_1 and may thus elevate the first pins 100_1 to be in contact with the bottom of the substrate W. Once the first pins 100_1 are placed in contact with, and adsorb, the substrate W, negative pressure may be measured from the through holes 130 of the first pins 100_1.

Figure 13:
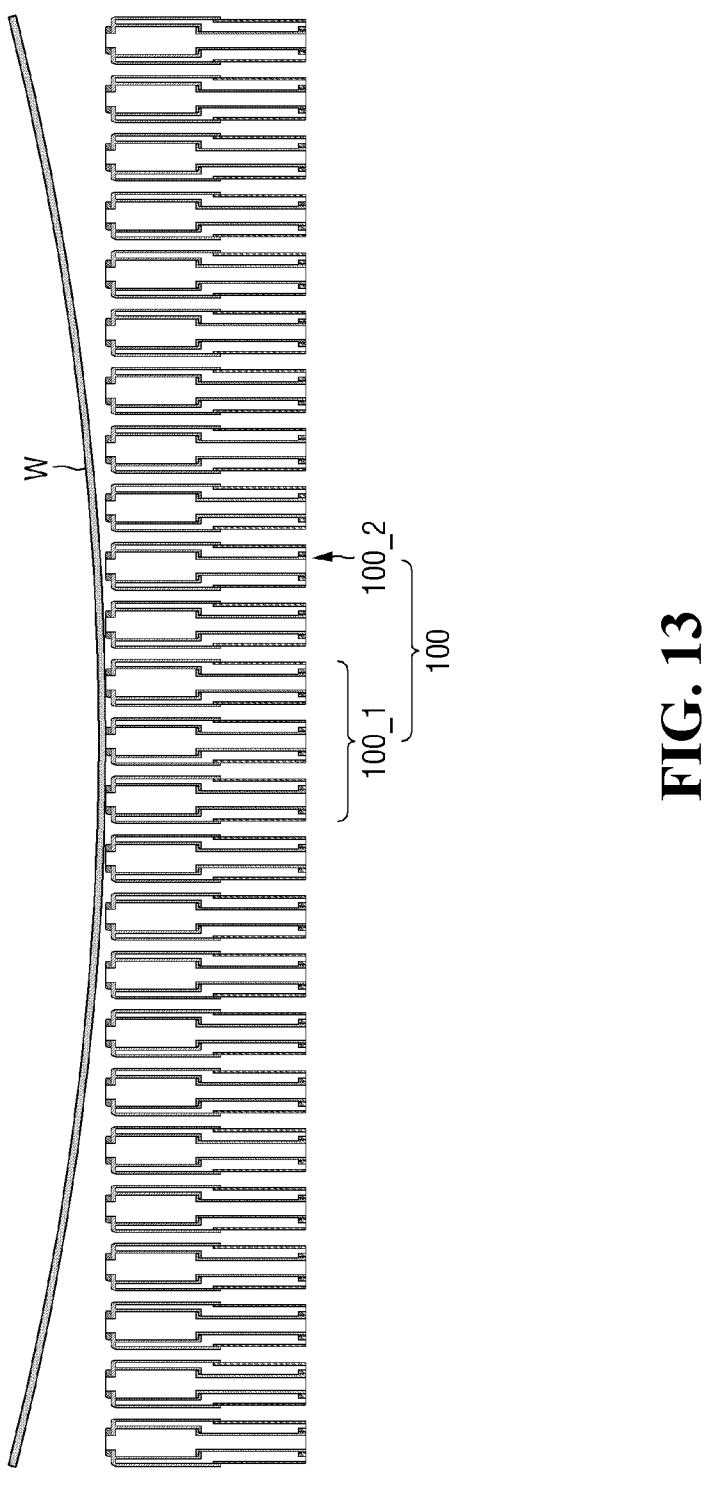

Thereafter, referring to FIGS. 11 and 13, the second pins 100_2 are elevated (S320).

Specifically, the second pump 320 may provide positive pressure to the second pins 100_2 by injecting the air into the pressure spaces 123 of the second pins 100_2, and may thus elevate the second pins 100_2. Parts of the elevated second pins 100_2 may be in contact with the substrate W. Alternatively, the elevated second pins 100_2 may not be in contact with the substrate W.

Figure 14:
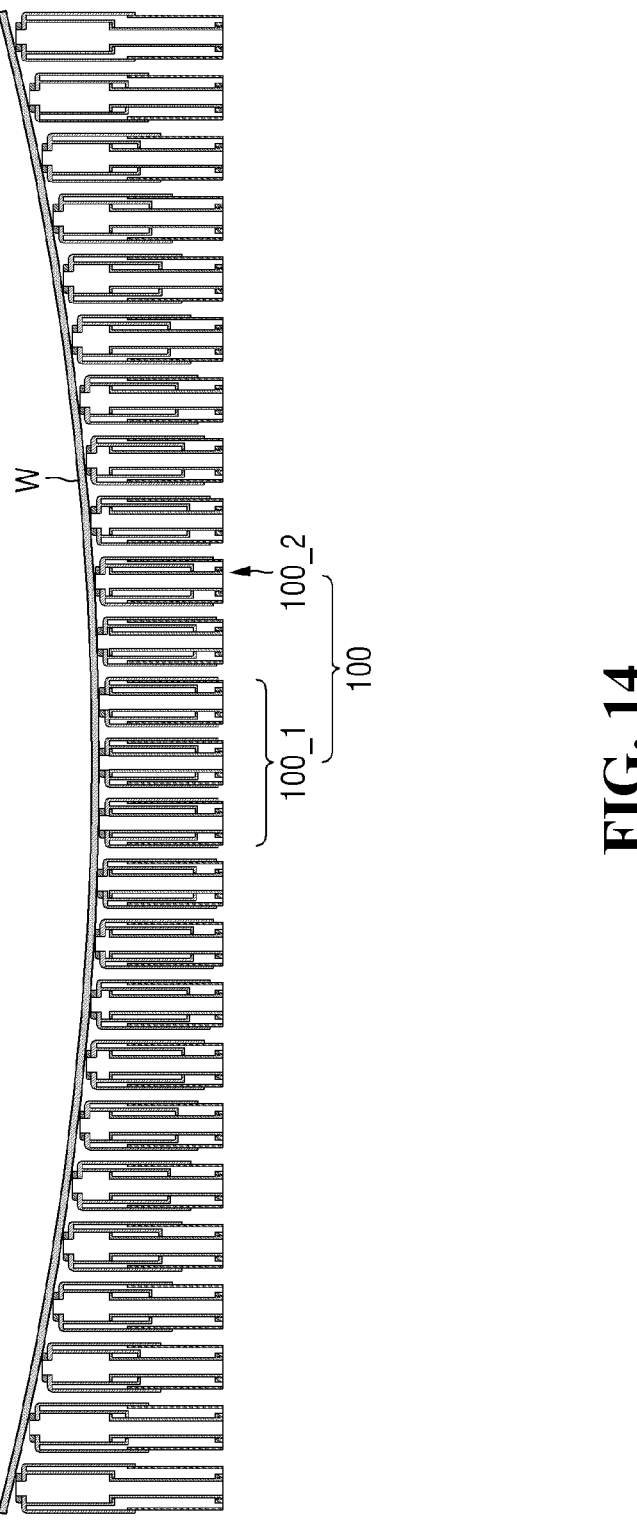

Thereafter, referring to FIGS. 11 and 14, the heights of the first pins 100_1 and the second pins 100_2 are controlled, and the substrate W is adsorbed (S330).

Specifically, the positive pressure provided to the pressure spaces 123 of the first pins 100_1 and the pressure spaces 123 of the second pins 100_2 is blocked, and the injected air is vented. As the positive pressure provided to the pressure spaces 123 is released, the power that elevates the first pins 100_1 and the second pins 100_2 is blocked. The substrate W may receive a force, in the direction toward the stage 10, from gravity and negative pressure provided by the vacuum pump 200. Since the pressure spaces 123 of the second pins 100_2 are connected to one another, the second pins 100_2 share pressure. Thus, the height of the second pins 100_2 may be controlled along the curvature of the substrate W. As the substrate W is lowered by the received force, the substrate W may be sequentially placed in contact with the second pins 100_2. For example, the substrate W may be placed in contact with second pins 100_2 close to the first pins 100_1 first. Once the second pins 100_2 are in contact with, and adsorb, the substrate W, negative pressure may be measured from the through holes 130 of the second pins 100_2.

Figure 15:
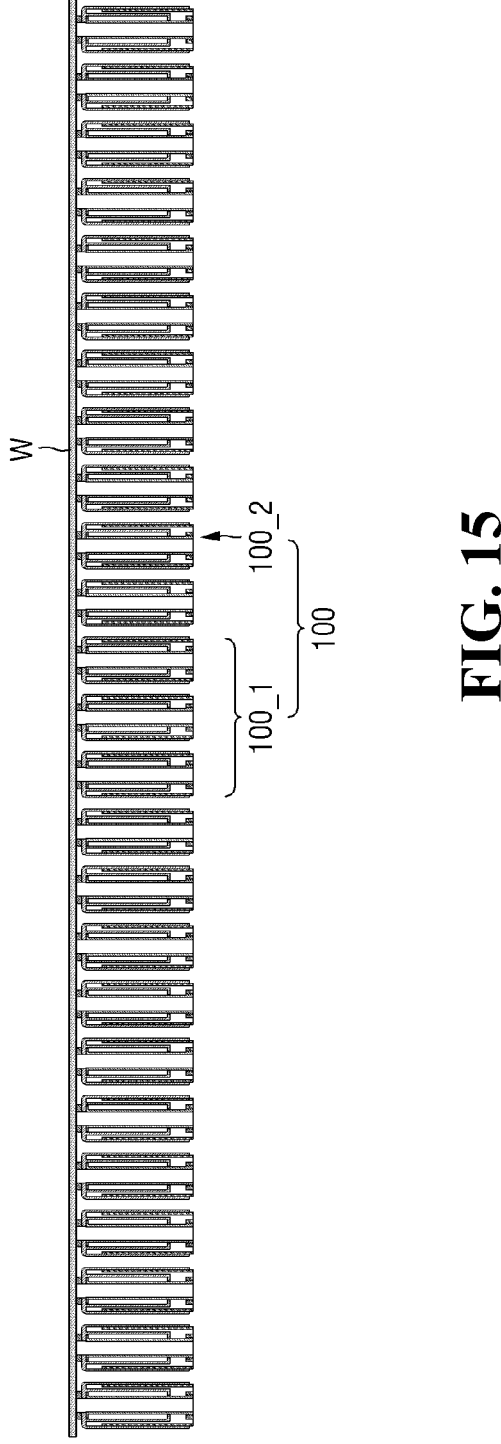

Thereafter, referring to FIGS. 11 and 15, the first pins 100_1 and the second pins 100_2 are lowered (S340).

Specifically, the first pins 100_1 may be lowered by receiving negative pressure from the first pump 310, and the second pins 100_2 may be lowered by receiving negative pressure from the second pump 320. Since negative pressure is already provided to the through holes 130 of the first pins 100_1 and the through holes 130 of the second pins 100_2, the substrate W may be lowered while being adsorbed by the first pins 100_1 and the second pins 100_2. As a result, warpage of the substrate W may be removed, and the substrate W may be planarized. Then, an exposure process may be performed on the planarized substrate W loaded on the stage 10. However, the present disclosure is not limited to an exposure process. For example, the stage 10 may be used not only in an exposure process, but also in a chip-on-wafer (COW) bonding process.

Figure 16:
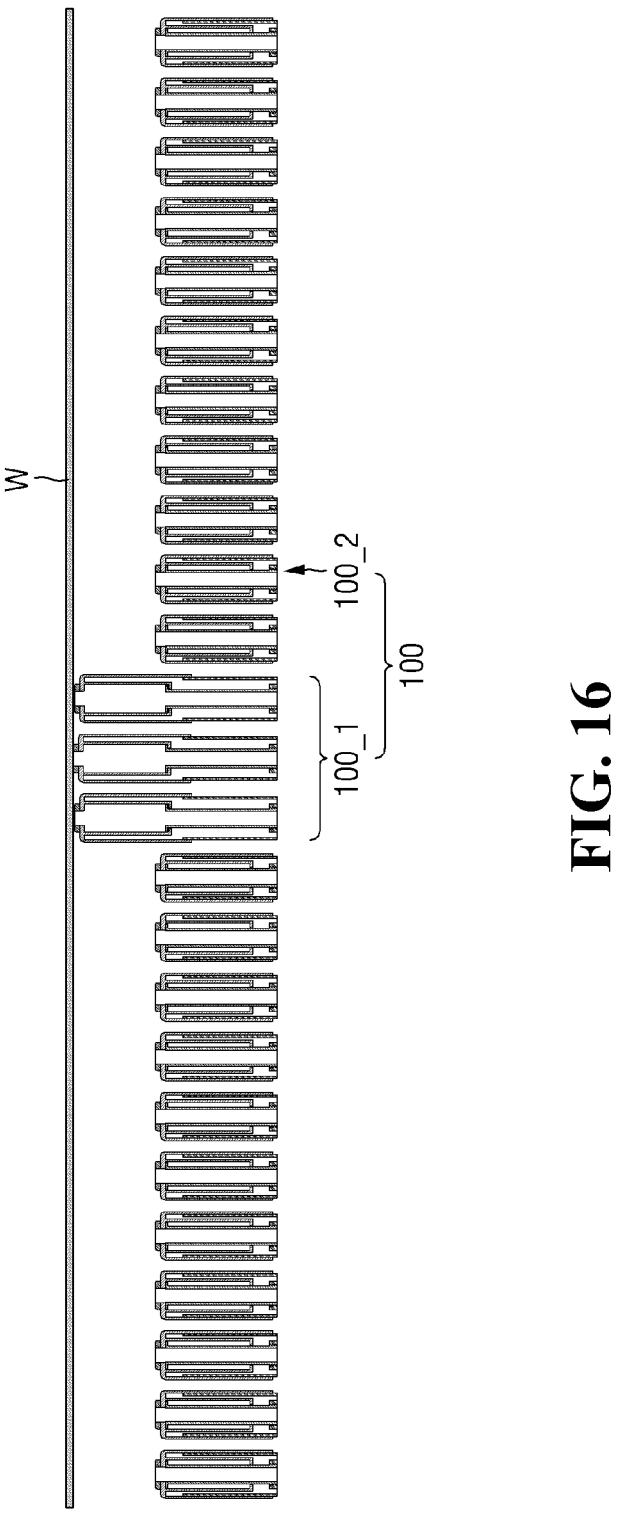

Thereafter, referring to FIGS. 11 and 16, the first pins 100_1 are elevated (S350).

Specifically, the substrate W of FIG. 16 may be a substrate W obtained after all the semiconductor manufacturing processes in the substrate processing apparatus are completed. The first pins 100_1 may be elevated by receiving positive pressure from the first pump 310. The elevated substrate W may be transferred by a transfer arm of a substrate transfer apparatus to subsequent semiconductor manufacturing processes.

Figure 17:
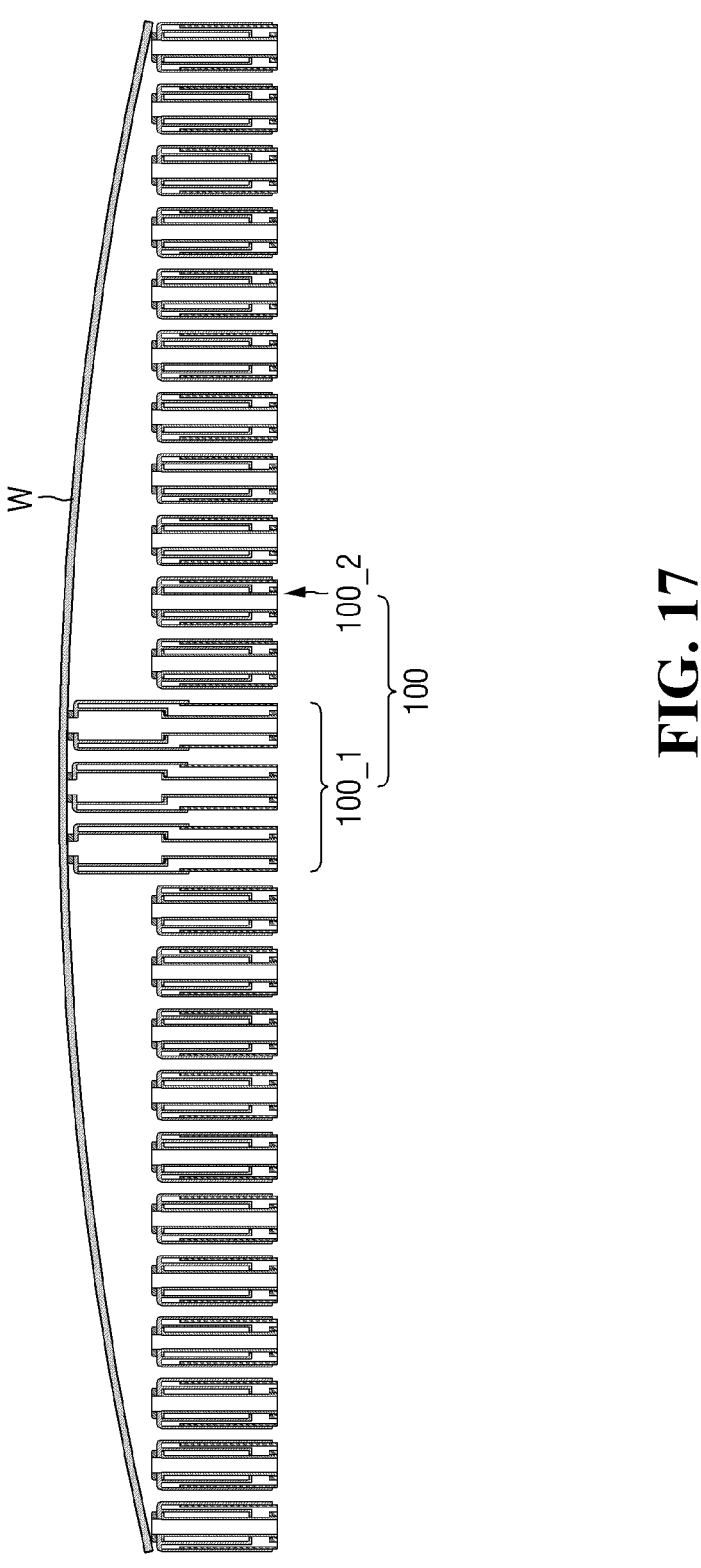
FIGS. 17 and 18 are cross-sectional views for explaining a driving method of a substrate processing apparatus according to another embodiment of the present disclosure.
Figure 18:
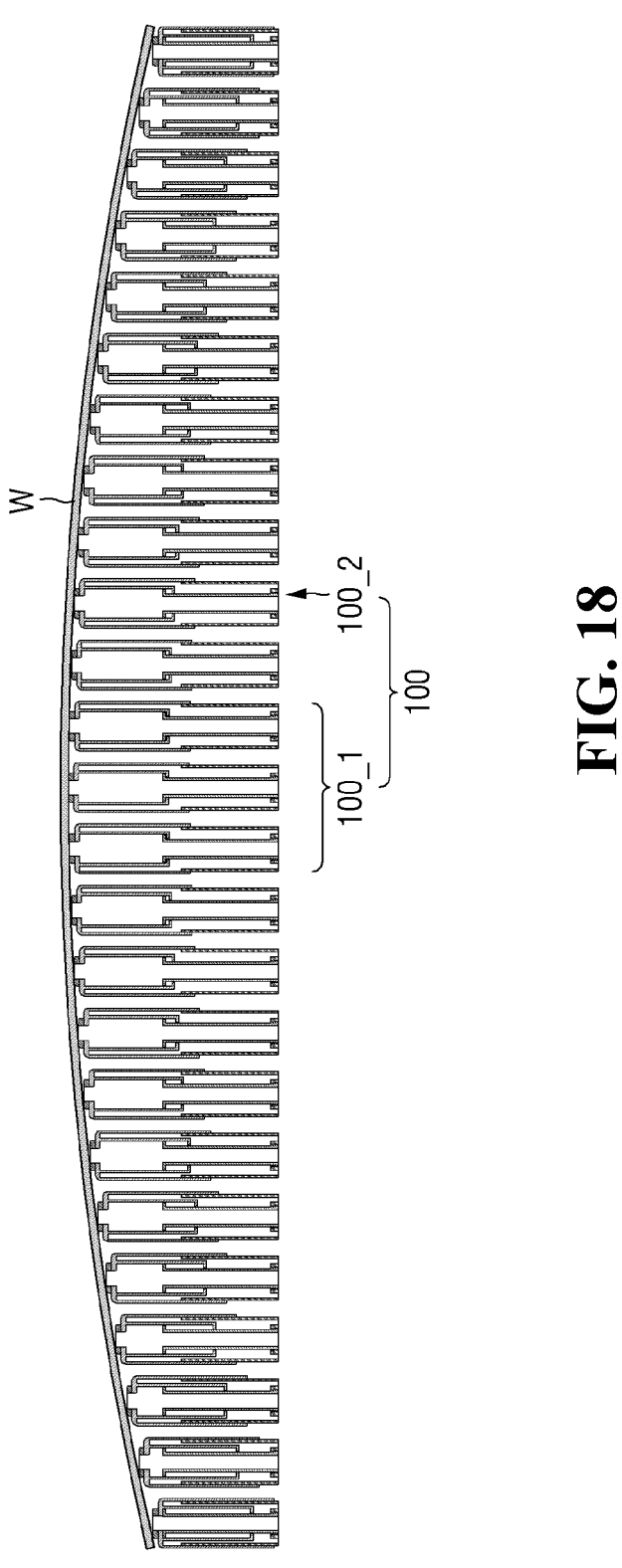

FIGS. 17 and 18 are cross-sectional views for explaining a driving method of a substrate processing apparatus according to another embodiment of the present disclosure. For convenience, the embodiment of FIGS. 17 and 18 will hereinafter be described, focusing mainly on the differences with the embodiment of FIGS. 12 through 16.

Referring to FIG. 17, the first pins 100_1 are elevated to adsorb a substrate W (S310).

Specifically, the substrate W may have a convexly curved surface in a direction away from the stage 10. A loading arm moves the substrate W over the stage 10. Negative pressure may be provided to the first pins 100_1 and the second pins 100_2 by the vacuum pump 200. The first pump 310 may provide positive pressure to the pressure spaces 123 of the first pins 100_1 and may thus elevate the first pins 100_1 to be in contact with the bottom of the substrate W. The height of the first pins 100_1 may be controlled such that the first pins 100_1 may be in contact with the substrate W, and the first pins 100_1 may adsorb the substrate W while being in contact with the substrate W.

Thereafter, the second pins 100_2 are elevated (S320). Although not specifically illustrated, S320 of the embodiment of FIGS. 17 through 18 may be similar to its counterpart of the embodiment of FIGS. 12 through 16 (particularly, FIG. 13).

Thereafter, referring to FIG. 18, the heights of the first pins 100_1 and the second pins 100_2 are controlled, and the substrate W is adsorbed (S330).

Specifically, the positive pressure provided to the pressure spaces 123 of the first pins 100_1 and the pressure spaces 123 of the second pins 100_2 is blocked, and injected air is vented. As the positive pressure provided to the pressure spaces 123 is released, the power that elevates the first pins 100_1 and the second pins 100_2 is blocked. The substrate W may receive a force, in a direction toward the stage 10, from gravity and negative pressure provided by the vacuum pump 200. Since the pressure spaces 123 of the second pins 100_2 are connected to one another, the second pins 100_2 share pressure. Thus, the height of the second pins 100_2 may be controlled along the curvature of the substrate W. As the substrate W is lowered by the received force, the substrate W may be sequentially placed in contact with the second pins 100_2. For example, the substrate W may be placed in contact with the second pins 100_2 in the order from second pins 100_2 near the outer circumference of the stage 10 to second pins 100_2 near the center of the stage 10. Once the second pins 100_2 are in contact with, and adsorb, the substrate W, negative pressure may be measured from the through holes 130 of the second pins 100_2.

Thereafter, the first pins 100_1 and the second pins 100_2 are lowered (S340), and the first pins 100_1 are elevated again (S350). S340 and S350 of the embodiment of FIGS. 17 and 18 may be similar to their respective counterparts of the embodiment of FIGS. 12 through 16 (particularly, FIGS. 15 and 16).

Figure 19:
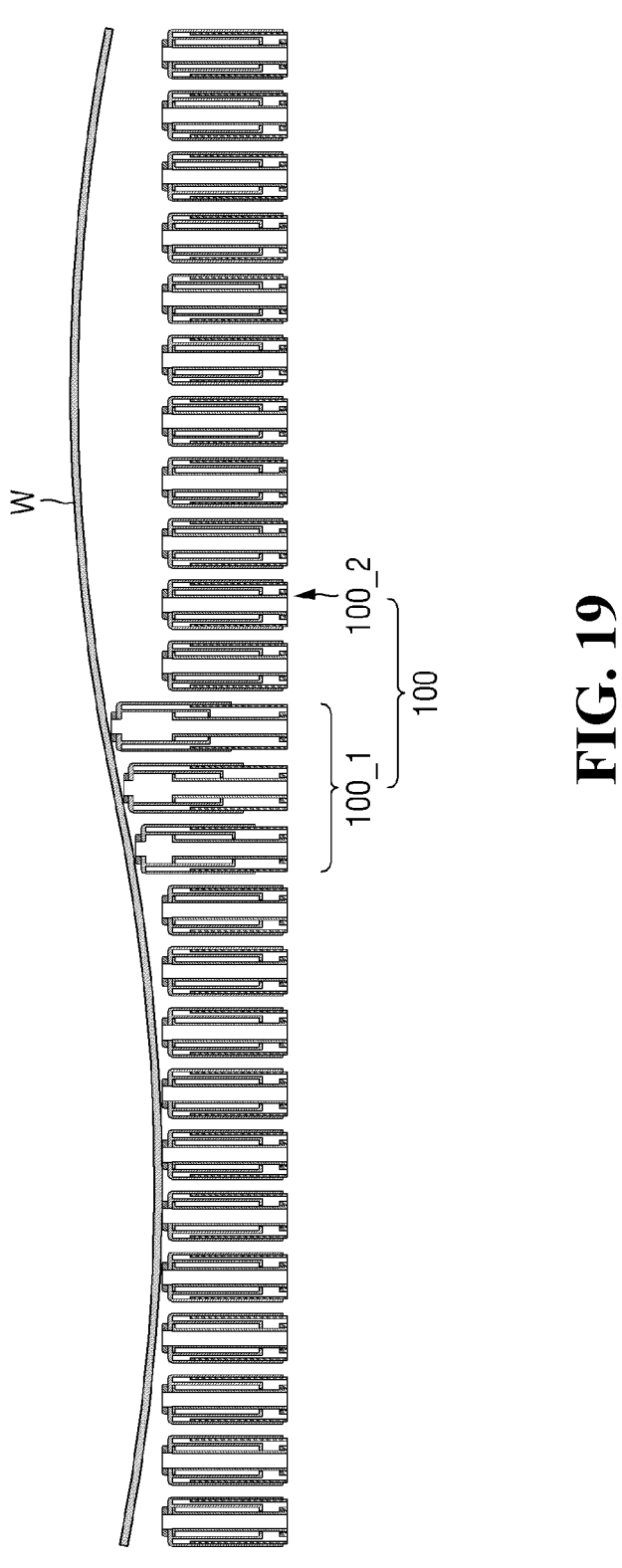
FIGS. 19 and 20 are cross-sectional views for explaining a driving method of a substrate processing apparatus according to another embodiment of the present disclosure.
Figure 20:
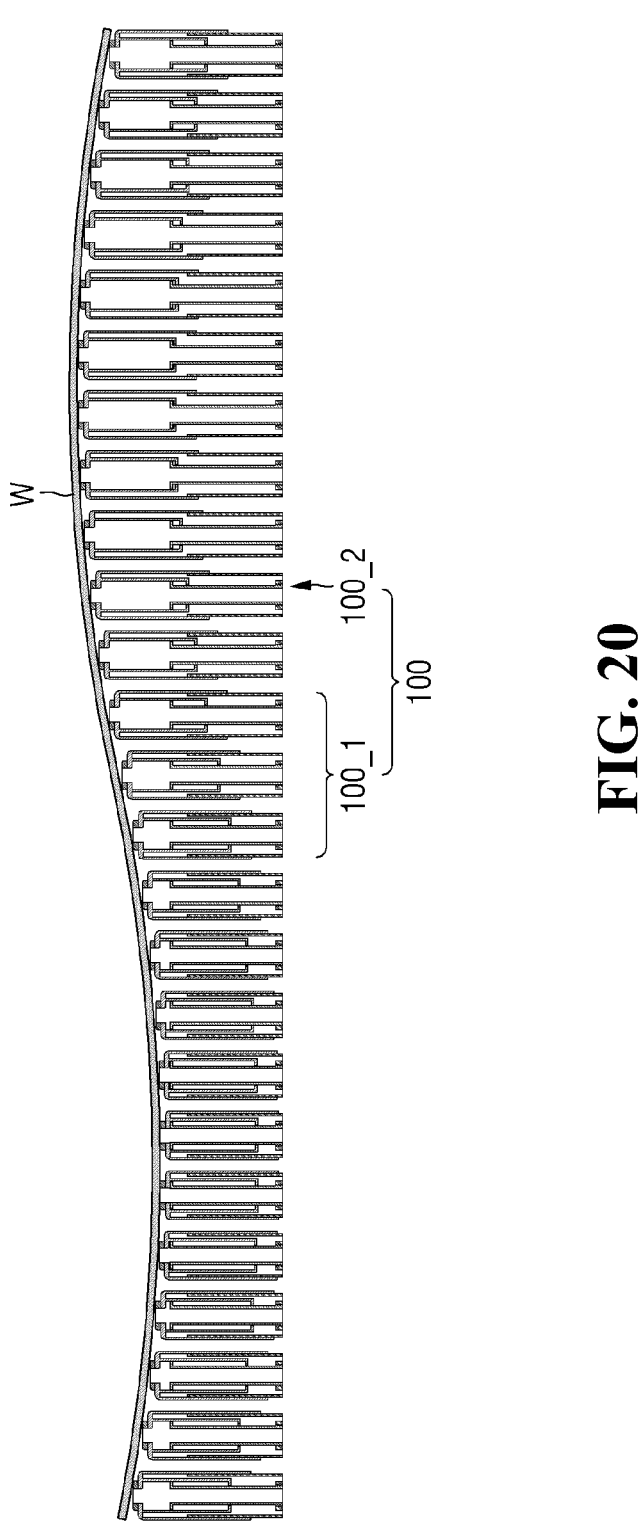

FIGS. 19 and 20 are cross-sectional views for explaining a driving method of a substrate processing apparatus according to another embodiment of the present disclosure. For convenience, the embodiment of FIGS. 19 and 20 will hereinafter be described, focusing mainly on the differences with the embodiment of FIGS. 12 through 16.

Referring to FIG. 19, the first pins 100_1 are elevated to adsorb a substrate W (S310).

Specifically, one part of the substrate W may have a convexly-curved surface in a direction away from the stage, and another part of the substrate W may have a convexly-curved surface in a direction toward the stage 10. A loading arm moves the substrate W over the stage 10. Negative pressure may be provided to the first pins 100_1 and the second pins 100_2 by the vacuum pump 200. The first pump 310 may provide positive pressure to the pressure spaces 123 of the first pins 100_1 and may thus elevate the first pins 100_1 to be in contact with the bottom of the substrate W. The height of the first pins 100_1 may be controlled such that the first pins 100_1 may be in contact with the substrate W, and the first pins 100_1 may adsorb the substrate W while being in contact with the substrate W.

Thereafter, the second pins 100_2 are elevated (S320). Although not specifically illustrated, S320 of the embodiment of FIGS. 19 and 20 may be similar to its counterpart of the embodiment of FIGS. 12 through 16 (particularly, FIG. 13).

Thereafter, referring to FIG. 20, the heights of the first pins 100_1 and the second pins 100_2 are controlled, and the substrate W is adsorbed (S330).

Specifically, the positive pressure provided to the pressure spaces 123 of the first pins 100_1 and the pressure spaces 123 of the second pins 100_2 is blocked, and injected air is vented. As the positive pressure provided to the pressure spaces 123 is released, the power that elevates the first pins 100_1 and the second pins 100_2 is blocked. The substrate W may receive a force, in the direction toward the stage 10, from gravity and negative pressure provided by the vacuum pump 200. Since the pressure spaces 123 of the second pins 100_2 are connected to one another, the second pins 100_2 share pressure. Thus, the height of the second pins 100_2 may be controlled along the curvature of the substrate W. As the substrate W is lowered by the received force, the substrate W may be sequentially placed in contact with the second pins 100_2. For example, the substrate W may be placed in contact with the second pins 100_2 in the order from part of the substrate W close to the stage 10 to part of the substrate W apart from the stage 10. Once the second pins 100_2 are in contact with, and adsorb, the substrate W, negative pressure may be measured from the through holes 130 of the second pins 100_2.

Thereafter, the first pins 100_1 and the second pins 100_2 are lowered (S340), and the first pins 100_1 are elevated again (S350). S340 and S350 of the embodiment of FIGS. 19 and 20 may be similar to their respective counterparts of the embodiment of FIGS. 12 through 16 (particularly, FIGS. 15 and 16).

In concluding the detailed description, those skilled in the art will appreciate that many variations and modifications may be made to the example embodiments without substantially departing from the principles of the present inventive concept. Therefore, the disclosed example embodiments of the inventive concept are used in a generic and descriptive sense only and not for purposes of limitation.

What is claimed is:

1. A substrate processing apparatus comprising:

a stage including a first region and a second region surrounding the first region, the stage configured to receive a substrate;

a plurality of pins in or on the stage and configured to adsorb the substrate with negative pressure, wherein the plurality of pins include a plurality of first pins in the first region configured to be elevated at a same time, and a plurality of second pins in the second region configured to be elevated at a same time; and a controller configured to cause:

the plurality of first pins to be elevated to adsorb the substrate before the plurality of second pins are elevated to adsorb the substrate, and the plurality of pins to be lowered after both the plurality of first pins and the plurality of second pins adsorb the substrate, wherein each of the plurality of pins includes a through hole configured to be provided with the negative pressure, and a pressure space disposed around and fluidly isolated from the through hole and configured to provide positive-or-negative pressure.

2. The substrate processing apparatus of claim 1, wherein each of the plurality of pins includes a sub-pin configured to contact the substrate and to be elevated and lowered, a support member fixed in the stage below the sub-pin, the through hole penetrating the sub-pin and the support member, and the pressure space configured to provide the positive-or-negative pressure to the sub-pin.

3. The substrate processing apparatus of claim 2, wherein a height of the plurality of pins above the stage is controllable by releasing the positive-or-negative pressure provided by the pressure space to the sub-pins of the plurality of pins such that the plurality of pins are in contact with the substrate.

4. A substrate processing apparatus, comprising:

a stage including a first region and a second region surrounding the first region, the stage configured to receive a substrate;

a plurality of pins in or on the stage and configured to adsorb the substrate with negative pressure, wherein each of the plurality of pins includes a sub-pin, a through hole configured to be provided with the negative pressure, and a pressure space configured to provide positive-or-negative pressure to the sub-pin, wherein the plurality of pins include a plurality of first pins in the first region, and a plurality of second pins in the second region;

a vacuum pump fluidly connected to the through holes of the plurality of pins and configured to provide the negative pressure to adsorb the substrate;

a first pump fluidly connected to the pressure spaces of the plurality of first pins and configured to provide the positive-or-negative pressure to elevate or lower the plurality of first pins at a same time; and a second pump fluidly connected to the pressure spaces of the plurality of second pins and configured to provide the positive-or-negative pressure to elevate or lower the plurality of second pins at a same time.

5. The substrate processing apparatus of claim 2, wherein each of the plurality of pins further includes an adsorption member above the sub-pin and positioned to contact the substrate.

6. The substrate processing apparatus of claim 1, wherein the plurality of first pins is three first pins.

7. The substrate processing apparatus of claim 1, wherein a number of the plurality of second pins is greater than a number of the plurality of first pins.

8. The substrate processing apparatus of claim 4, wherein, in operation, the plurality of pins are configured to be lowered after the plurality of first pins and the plurality of second pins are elevated and adsorb the substrate.

9. The substrate processing apparatus of claim 8, wherein:

in operation, the plurality of first pins and the plurality of second pins are configured to be provided with the negative pressure when the plurality of pins are lowered, and the substrate is configured to be in contact with a surface of the stage when the substrate is adsorbed by the plurality of first pins and the plurality of second pins.

10. A substrate processing apparatus comprising:

a stage including a first region and a second region surrounding the first region, the stage configured to receive a substrate;

a plurality of pins in or on the stage and configured to adsorb the substrate with negative pressure, wherein each of the plurality of pins includes a sub-pin, a through hole configured to be provided with the negative pressure, and a pressure space configured to provide positive-or-negative pressure to the sub-pin, wherein the plurality of pins include a plurality of first pins in the first region, and a plurality of second pins in the second region;

a first pump configured to provide positive pressure of the positive-or-negative pressure to the pressure spaces of the plurality of first pins and/or the plurality of second pins; and a second pump configured to provide negative pressure of the positive-or-negative pressure to the pressure spaces of the plurality of first pins and/or the plurality of second pins.

11. The substrate processing apparatus of claim 10, wherein:

the first pump is configured to provide the positive-or-negative pressure as the positive pressure of the positive-or-negative pressure by injecting a liquid, and the second pump is configured to provide the positive-or-negative pressure as the negative pressure of the positive-or-negative pressure by releasing a liquid.

12. The substrate processing apparatus of claim 4, wherein a height of the plurality of pins above the stage is controllable by releasing the positive-or-negative pressure provided by the pressure space to the sub-pins of the plurality of pins such that the plurality of pins are in contact with the substrate.

13. The substrate processing apparatus of claim 4, wherein a number of the plurality of second pins is greater than a number of the plurality of first pins.

14. The substrate processing apparatus of claim 4, wherein, for each of the plurality of pins, the pressure space is disposed around and fluidly isolated from the through hole.

15. The substrate processing apparatus of claim 4, wherein:

the first pump is configured to provide the positive-or-negative pressure by injecting or releasing a liquid, and the second pump is configured to provide the positive-or-negative pressure by injecting or releasing a liquid.

16. The substrate processing apparatus of claim 12, wherein, for each of the plurality of pins, the pressure space is disposed around and fluidly isolated from the through hole.

17. The substrate processing apparatus of claim 10, wherein a height of the plurality of pins above the stage is controllable by releasing the positive-or-negative pressure provided by the pressure space to the sub-pins of the plurality of pins such that the plurality of pins are in contact with the substrate.

18. The substrate processing apparatus of claim 10, wherein a number of the plurality of second pins is greater than a number of the plurality of first pins.

19. The substrate processing apparatus of claim 10, wherein, for each of the plurality of pins, the pressure space is disposed around and fluidly isolated from the through hole.

20. The substrate processing apparatus of claim 10, wherein, in operation, the plurality of pins are configured to be lowered after the plurality of first pins and the plurality of second pins are elevated and adsorb the substrate.

* * * * *